United States Patent
Barr et al.

(10) Patent No.: US 7,350,109 B2
(45) Date of Patent: Mar. 25, 2008

(54) SYSTEM AND METHOD FOR TESTING A MEMORY USING DMA

(75) Inventors: Andrew H. Barr, Roseville, CA (US); Ken G. Pomaranski, Roseville, CA (US); Dale J. Shidla, Roseville, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 560 days.

(21) Appl. No.: 10/714,302

(22) Filed: Nov. 14, 2003

(65) Prior Publication Data

US 2005/0120268 A1 Jun. 2, 2005

(51) Int. Cl.
*G06F 11/00* (2006.01)
(52) U.S. Cl. .......................... 714/27; 714/43
(58) Field of Classification Search .............. 714/27, 714/9
See application file for complete search history.

(56) References Cited

U.S. PATENT DOCUMENTS

| | | | | |
|---|---|---|---|---|
| 4,315,330 | A | * | 2/1982 | Brickman et al. .......... 370/241 |
| 4,878,168 | A | * | 10/1989 | Johnson et al. ............. 714/27 |
| 5,423,029 | A | | 6/1995 | Schieve |
| 5,446,741 | A | * | 8/1995 | Boldt et al. ................ 714/718 |
| 5,619,513 | A | * | 4/1997 | Shaffer et al. ............. 714/736 |
| 5,621,883 | A | * | 4/1997 | Thoulon et al. ............... 714/9 |
| 5,668,815 | A | | 9/1997 | Gittinger et al. |
| 6,002,868 | A | * | 12/1999 | Jenkins et al. .............. 717/105 |
| 6,178,533 | B1 | * | 1/2001 | Chang ....................... 714/739 |
| 6,480,982 | B1 | | 11/2002 | Chan et al. |
| 7,089,458 | B2 | * | 8/2006 | Ishitsuka et al. ............ 714/43 |
| 7,089,465 | B2 | * | 8/2006 | Lee .......................... 714/718 |
| 7,162,625 | B2 | * | 1/2007 | Stern et al. ................... 713/2 |
| 2003/0115385 | A1 | * | 6/2003 | Adamane et al. ............ 710/22 |
| 2004/0216018 | A1 | * | 10/2004 | Cheung ..................... 714/724 |
| 2005/0107987 | A1 | * | 5/2005 | Barr et al. .................. 702/186 |
| 2006/0200712 | A1 | * | 9/2006 | Mulligan ................... 714/718 |

FOREIGN PATENT DOCUMENTS

GB 2268295 A 5/1994
WO WO 98/07163 2/1998

OTHER PUBLICATIONS

Microsoft Computer Dictionary, Microsoft Press, 4th Ed., 1999, pp. 112, 321.*
OpenMP API User's Guide, Sun Microsystems, Inc., 2005, Chapter 7, section 7.2.*
Microsoft Computer Dictionary 4th Ed., Microsoft Press, 1999, p. 85.*
New Illustrated Websters Dictionary of the English Language, PMC Publishing Company, Inc., 1995, pp. 206, 222.□□.*
A copy of Search Report for Application No. GB0423454.8 mailed on Feb. 3, 2005.

* cited by examiner

*Primary Examiner*—Christopher McCarthy

(57) ABSTRACT

A computer system that includes a processor, a first bus coupled to the processor, a memory controller coupled to the first bus, a memory coupled to the memory controller, a first input/output (I/O) controller coupled to the first bus, and a test module coupled to the first I/O controller is provided. The test module is configured to cause tests to be performed on the memory using the first bus.

20 Claims, 4 Drawing Sheets

SYSTEM AND METHOD FOR TESTING A MEMORY USING DMA

BACKGROUND

Computer systems generally include one or more processors and a memory system. The memory system often includes multiple levels of memory devices that range from relatively fast and expensive memory to relatively slow and inexpensive memory. One of the first levels of a memory system is referred to as main memory usually comprises some form of Random Access Memory (RAM). In operation, a computer system loads an operating system and one or more applications into the main memory so that they may be executed by the processor(s).

Because the main memory contains the operating system and applications, it can be a critical component of the computer system. Failures that occur in the main memory can cause broader failures to occur in the system and possibly cause the system to crash. As a result, it is generally desirable to detect errors in the main memory before they cause failures.

Memory errors may be detected by writing known information to a memory and then reading the information back to determine whether it is correct. Some memory errors, however, may be pattern sensitive and may only appear in response to selected information patterns being written to the memory. Some diagnostic testing of a memory may occur in response to a computer system being turned on or reset. This type of testing, however, may not detect errors in computer systems that are left on and not reset for extended periods of time.

Although some memory devices include error correction features that work during operation of a computer system, these features typically detect errors only in response to a specific memory location being read. Because many areas of a memory may not be read with regularity, errors that occur in these areas may go undetected until an access to a faulty memory location takes place.

Accordingly, it would be desirable to be able to detect errors in all areas of a main memory of a computer system before the errors cause failures to occur during operation of the system.

SUMMARY

According to one exemplary embodiment, a computer system is provided that includes a processor, a first bus coupled to the processor, a memory controller coupled to the first bus, a memory coupled to the memory controller, a first input/output (I/O) controller coupled to the first bus, and a test module coupled to the first I/O controller. The test module is configured to cause tests to be performed on the memory using the first bus.

DETAILED DESCRIPTION

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

In one aspect of the present disclosure, a computer system includes a test module coupled to an input/output (I/O) controller. The test module is configured to test a portion of the main memory of the computer system during operation of the computer system, i.e., subsequent to the operating system being booted and during execution of the operating system. The test module provides test transactions to the I/O controller which causes the tests to be performed on the main memory using direct memory access (DMA). The test module may cause remedial action to be taken in response to errors being detected during the tests.

Figure 1:
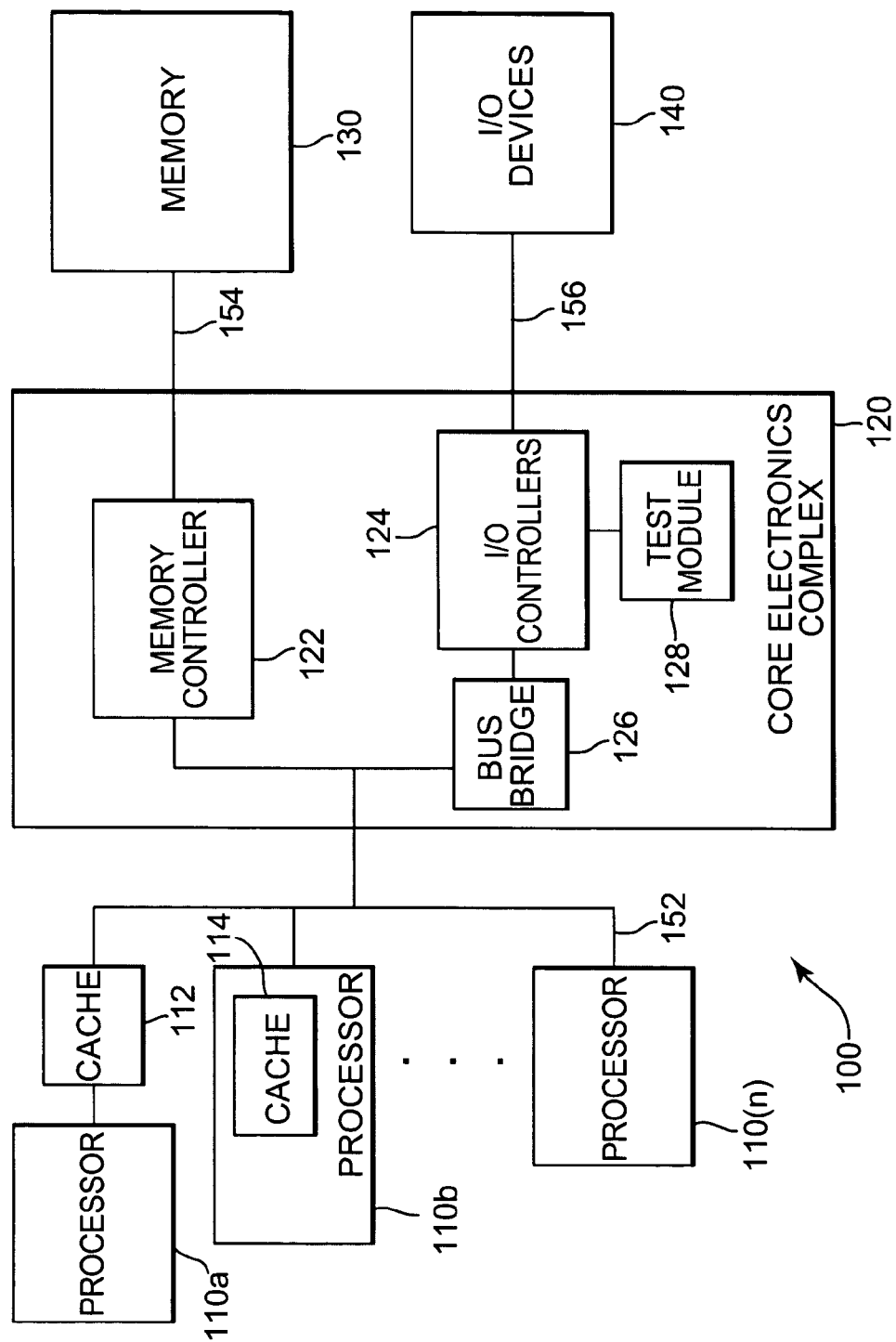
FIG. 1 is a block diagram illustrating an embodiment of a computer system configured to test a memory during operation using DMA.

FIG. 1 is a block diagram illustrating an embodiment of a computer system 100 configured to test a memory during operation using direct memory access (DMA). Computer system 100 may be any type of computer system such as a handheld, desktop, notebook, mobile, workstation, or server computer. Computer system 100 includes processors 110a through 110(n), a core electronics complex 120, a memory 130, and a set of input/output (I/O) devices 140. Processors 110a through 110(n) are each coupled to core electronics complex 120 using a set of bus connections 152. Bus connections 152 comprise a set of system busses. Core electronics complex 120 is coupled to memory 130 and I/O devices 140 using connections 154 and 156, respectively. Core electronics complex 120 may also be referred to as a chipset.

Computer system 100 includes any number of processors 110 greater than or equal to one. As used herein, 'processor 110' refers to any one of processors 110a through 110(n), and 'processors 110' refers to the set of processors 110a through 110(n).

Processor 110a is coupled to a cache 112, and processor 110b includes a cache 114. Caches 112 and 114 may store any type of information such as instructions and data. Other processors 110 may include or be operable with any type or number of caches.

Computer system 100 also includes an operating system (not shown) that is executable by one or more of processors 110. In response to being turned on or reset, one or more of processors 110 cause the operating system to be booted and executed. Processors 110 execute instructions from the operating system and other programs using memory 130.

Core electronics complex 120 includes a memory controller 122, a set of I/O controllers 124, a bus bridge 126, and test module 128. Memory controller 122 is configured to store information into and read information from memory 130 in response to write and read transactions, respectively, from processors 110, test module 128, and I/O devices 140. Memory controller 122 may include hardware and/or software configured to perform memory scrubbing or other error correction functions on memory 130 in response to reading information from memory 130.

I/O controllers 124 may include any type and number of controllers configured to manage one or more I/O devices 140. Examples of I/O controllers 124 include IDE/ATA controllers, SATA controllers, PCI controllers, SCSI controllers, USB controllers, IEEE 1394 (Firewire) controllers, PCMCIA controllers, parallel port controllers, and serial port controllers. In one embodiment, I/O controllers 124 comprise multiple microchips that include an intermediate bus coupled to bus bridge 126, PCI controllers coupled to the intermediate bus, and SCSI, IDE and others controllers coupled to the PCI controllers.

Memory 130 comprises any type of memory managed by memory controller 122 such as RAM, SRAM, DRAM, SDRAM, and DDR SDRAM. In response to commands from system firmware (not shown) or the operating system, memory controller 130 may cause information to be loaded from an I/O device 140 such as a hard drive or a CD-ROM drive into memory 130.

I/O devices 140 may include any type and number of devices configured to communicate with computer system 100 using I/O controllers 124. Each I/O device 140 may be internal or external to computer system 100 and may couple to an expansion slot that is in turn coupled to an I/O controller 124. /O devices 140 may include a network device (not shown) configured to allow computer system 100 to communicate with other computer systems and a storage device (not shown) configured to store information.

Test module 128 is configured to cause tests to be performed on memory 130 during operation of computer system using DMA by generating test transactions and providing the test transactions to one of I/O controllers 124. The test transactions include read and write transactions configured to cause information to be read from and written to memory 130, respectively. The test transactions may include pattern tests or any other type or combination of read and write transactions configured to verify the operation and functionality of selected locations in memory 130.

Computer system 100 includes multiple DMA channels that allow test module 128 and I/O devices 140 to interact with memory 130. To use DMA, test module 128 or an I/O device 140 sends a DMA transaction, such as a test transaction, to I/O controller 124. The DMA transaction goes from I/O controller 124 to bus bridge 126 then to memory controller 122 using a bus connection 152. Memory controller 122 causes the DMA transaction to be performed.

Test module 128 may be tailored to operate in conjunction with memory controller 122 depending on the level of error correction functionality that is included in memory controller 122. For example, in embodiments where memory controller 122 implements memory scrubbing or other error correction mechanisms, test module 128 may be configured to primary generate read transactions. In response to the read transactions, the memory scrubbing or error correction functions of memory controller 122 detect and, if possible, fix errors in memory 130. In embodiments where memory controller 122 does not include memory scrubbing or other error correction mechanisms, test module 128 may be configured to write patterns to memory 130 and read back the patterns from memory 130 to detect errors.

Figure 2:
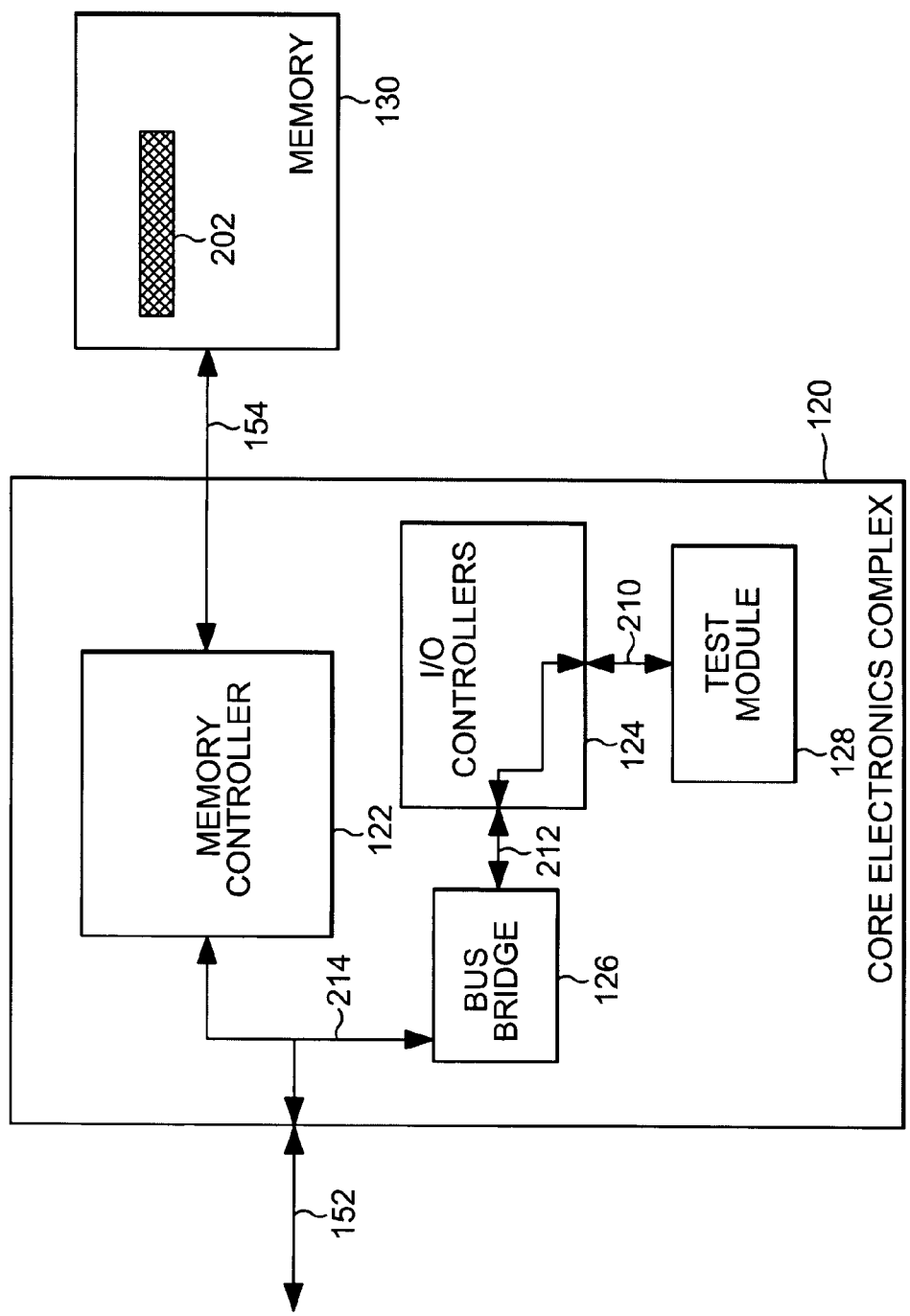
FIG. 2 is a block diagram illustrating an embodiment of portions of the computer system shown in FIG. 1.
Figure 3:
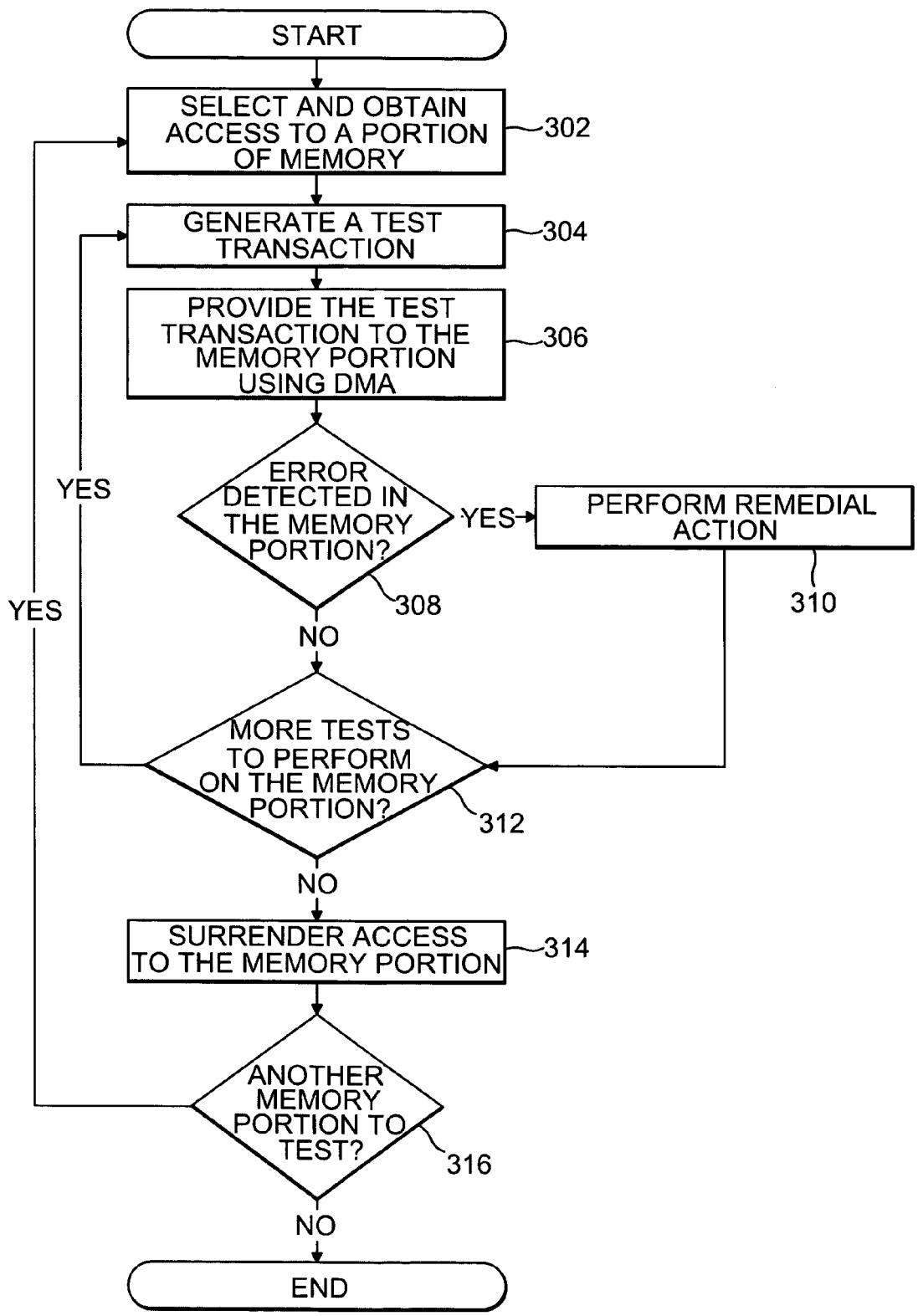
FIG. 3 is a flow chart illustrating an embodiment of a method for testing a memory during operation of a computer system using DMA.

The operation of test module 128 will now be described with reference to FIGS. 2 and 3. FIG. 2 is a block diagram illustrating an embodiment of portions of computer system 100, and FIG. 3 is a flow chart illustrating an embodiment of a method for testing memory 130 during operation of computer system 100 using DMA. The method is performed by test module 128.

Test module 128 selects and obtains access to a portion 202 of memory 130 during operation of computer system 100 as indicated in a block 302. Depending on the implementation, test module 128 may obtain access to portion 202 by sending a request to the operating system, by sending a request to memory controller 122, by allocating an unused portion of memory 130, or by any other suitable method. In embodiments where memory controller 122 implements memory scrubbing or other error correction mechanisms, test module 128 may omit the step of obtaining access to a portion of memory 130 before testing the portion.

Test module 128 generates a test transaction as indicated in a block 304. The test transaction may be a read or write transaction that is configured to cause information to be read from or written to portion 202 in memory 130, respectively. Test module 128 provides the test transaction to memory 130 using DMA as indicated in a block 306. In the embodiment of FIG. 2, test module 128 accomplishes this by providing the test transaction to an I/O controller 124 using a connection 210. I/O controller 124 provides the transaction to bus bridge 126 using a connection 212. Bus bridge 126 provides the transaction to memory controller 122 using a bus connection 214. Bus connection 214 comprises one of the bus connections 152. Memory controller 122 causes the test transaction to be performed by reading information from or storing information to portion 202 in memory 130. In the case of a read transaction, memory controller 122 causes information to be read from portion 202 and provided to test module 128 using connections 214, 212, and 210.

A determination is made by test module 128 as to whether an error has been detected in portion 202 as indicated in a block 308. If test module 128 detects an error in portion 202, then remedial action is performed as indicated in a block 310. Remedial action may include fixing errors, logging addresses of errors, and/or notifying the operating system, memory controller 122, and/or a system administrator of the errors.

If test module 128 does not detect an error in portion 202, then a determination is made by test module 128 as to whether there are more tests to perform on portion 202 as indicated in a block 312. If there are more tests to perform on portion 202, then the function in block 304 is repeated.

If there are no more tests to perform on portion 202, then test module 128 surrenders access to portion 202 as indicated in a block 314. The function of block 314 may be omitted in embodiments where test module 128 omits the step of obtaining access to portions of memory 130.

A determination is made by test module 128 as to whether there is another portion in memory 130 to test as indicated in a block 316. If there is another portion in memory 130 to test, then the function of block 302 is repeated. If there is not another portion in memory 130 to test, then the method ends.

In embodiments where memory controller 122 is configured to perform memory scrubbing or other error correction functions in response to reading information from memory 130, errors may be detected and remedial action may be performed by memory controller 122 in response to the test transactions from test module 128. The remedial action may include fixing and logging the errors.

In certain embodiments, computer system 100 includes software diagnostics that can communicate with test module 128. In conjunction with the diagnostics, test module 128 may perform targeted read, write, and pattern testing of memory 130. In response to obtaining access to a portion of memory 130, test module 128 may test specific locations in memory 130 through any combination of reads, writes and pattern testing in response to communications from the diagnostics. The diagnostics may be included as part of the operating system or other applications or may be separate programs.

Test module 128 may be designed to allow a system administrator to configure tests to memory 130 using the operating system or another suitable interface. The operating system or interface may allow the administrator to select, for example, the time and frequency of tests, the particular portions of memory to test (e.g. frequently used portions), and the actions to be taken in the event of failures.

Test module 128 may comprise any suitable combination of hardware and software components.

Figure 4:
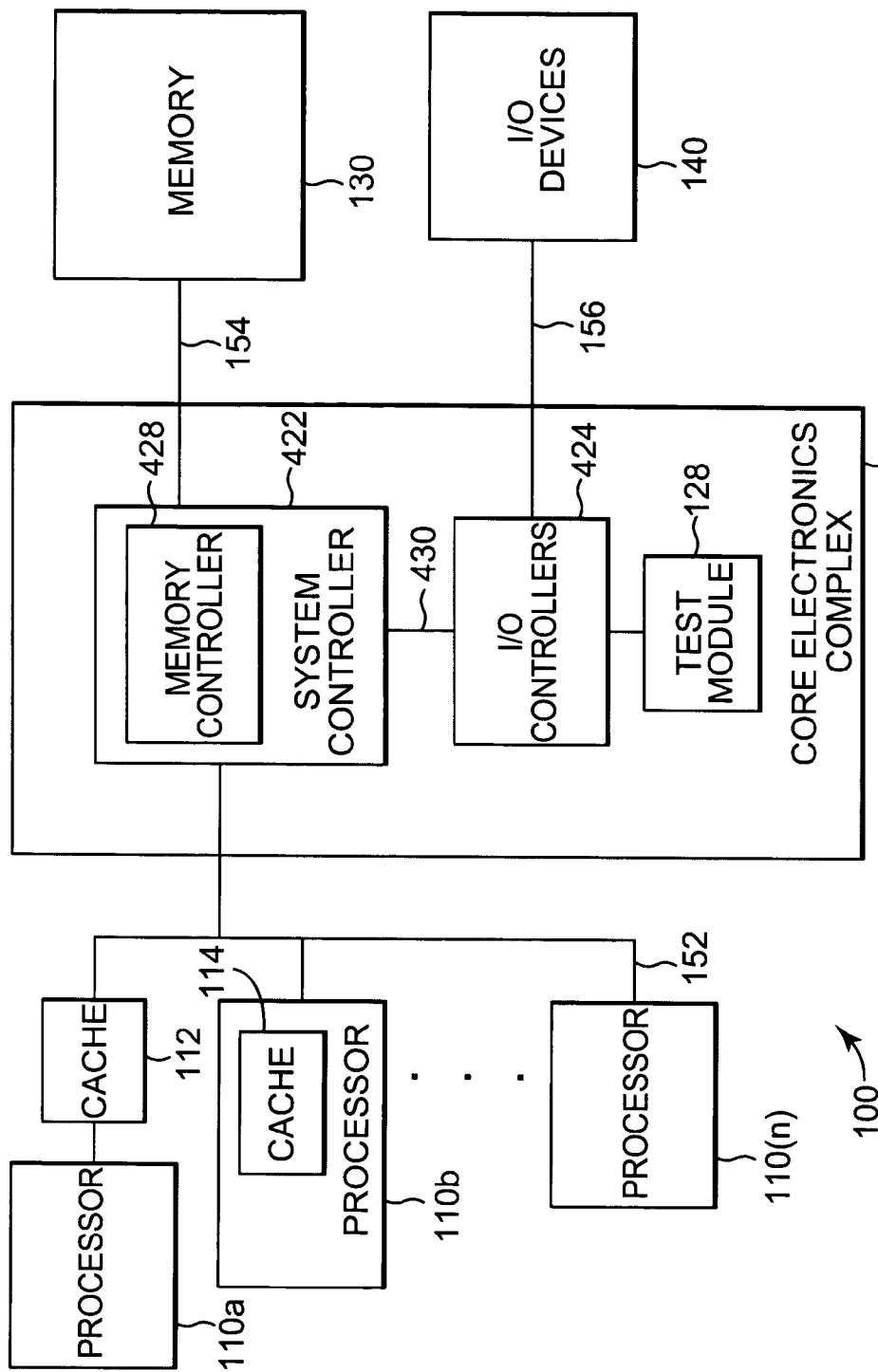
FIG. 4 is a block diagram illustrating an alternative embodiment of a computer system configured to test a memory during operation using DMA.

FIG. 4 is a block diagram illustrating an alternative embodiment of computer system 100 configured to test memory 130 during operation using DMA. In the embodiment shown in FIG. 4, core electronics complex 420 replaces core electronics complex 120. Core electronics complex 420 includes a system controller 422, I/O controllers 424, and test module 128. System controller 422 includes a memory controller 428.

Test module 128 operates in substantially the same way in the embodiment of FIG. 4 as it did in the embodiments of FIGS. 1, 2, and 3. In the embodiment of FIG. 4, DMA transactions are performed using one of a set of connections 430 between an I/O controller 424 and system controller 422 instead of using a bus connection 152. Accordingly, the test transactions of test module 128 go from test module 128 to an I/O controller 424 to system controller 422 using a connection 430. Memory controller 428 processes the test transactions and, in the case of read transactions, provides information associated with the read transactions back to the I/O controller 424 using connection 430.

As illustrated by FIG. 4, test module 128 is configured to operate with different arrangements of core electronic components or chipsets. Accordingly, test module 128 is also configured to operate with other core electronic components or chipsets not illustrated herein.

The above embodiments may provide advantages over systems that do not use DMA to detect memory errors. For example, a computer system may more easily correct memory errors detected using DMA than with other types of memory error detection. In addition, DMA accesses may require less processor overhead than operating system-level processes. Further, operating system-level processes may have recovery problems associated with the operating system.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A computer system comprising:
    a processor configured to execute an operating system;
    a first bus coupled to the processor;
    a memory; and
    a core electronics complex including:
        a memory controller coupled to the first bus and the memory;
        a first input/output (I/O) controller coupled to the first bus and configured to couple to a first set of one or more I/O devices using a first connection; and
        a test module coupled to the first I/O controller using a second connection that is separate from the first connection and the first bus;
    wherein the test module is configured to provide test transactions to the first I/O controller using the second connection, and wherein the first I/O controller is configured to provide the test transactions to the memory controller using the first bus to cause tests to be performed on the memory.

2. The computer system of claim 1 further comprising:
    the operating system;
    wherein the processor is configured to cause the operating system to be booted, and wherein the test module is configured to cause the tests to be performed on the memory using the first bus subsequent to the operating system being booted.

3. The computer system of claim 1 further comprising:
    the operating system;
    wherein the processor is configured to cause the operating system to be executed, and wherein the test module is configured to cause the tests to be performed on the memory using the first bus during execution of the operating system.

4. The computer system of claim 1 wherein the first bus comprises a system bus.

5. The computer system of claim 1 further comprising:
    a second bus; and
    a second set of one or more I/O devices coupled to the second bus;
    wherein the core electronics complex includes a second I/O controller coupled to the first bus and the second bus.

6. The computer system of claim 1 wherein the test transactions include read and write transactions.

7. The computer system of claim 6 wherein the read and write transactions comprise direct memory access (DMA) transactions.

8. The computer system of claim 1 further comprising:
    a bus bridge coupled to the first bus and the first I/O controller; and
    wherein the first I/O controller is configured to provide the test transactions to the bus bridge, and wherein the bus bridge is configured to provide the test transactions to the memory controller using the first bus.

9. A method performed by a computer system that includes a memory comprising:
    selecting a portion of the memory for testing during operation of the computer system;
    generating a test transaction in a test module coupled to an input/output (I/O) controller using a first connection that is separate from a second connection that is configured to couple the I/O controller to one or more I/O devices and separate from a system bus coupled to a processor, the test module and the I/O controller included in a chipset coupled to the memory and the system bus;
    providing the test transaction from the test module to the I/O controller using the first connection;
    providing the test transaction from the I/O controller to a memory controller; and
    providing the test transaction from memory controller to the portion using direct memory access (DMA).

10. The method of claim 9 further comprising:
  detecting an error that occurs in response to the test transaction; and
  performing a remedial action in response to detecting the error.

11. The method of claim 9 further comprising:
  providing the test transaction from the I/O controller to a bus bridge included in the chipset;
    providing the test transaction from the bus bridge to the system bus; and
    providing the test transaction from the system bus to the memory controller.

12. The method of claim 11 further comprising:
  storing information in the memory in response to the test transaction being a write transaction.

13. The method of claim 11 further comprising:
  in response to the test transaction being a read transaction:
    providing information associated with the test transaction from the portion to the memory controller;
    providing the information from the memory controller to the system bus;
    providing the information from the system bus to the bus bridge;
    providing the information from the bus bridge to the I/O controller; and
    providing the information from the I/O controller to the test module.

14. The method of claim 9 further comprising:
  providing the test transaction from the I/O controller to a system controller included in the chipset; and
    providing the test transaction from the system controller to the memory controller.

15. A computer system comprising:
  a processor configured to execute an operating system;
  a bus coupled to the processor;
  a memory;
  a core electronics complex including:
    a system controller coupled to the bus and the memory;
    an input/output (I/O) controller coupled to the system controller and configured to couple to a set of one or more I/O devices using a first connection; and
    a test module coupled to the I/O controller using a second connection that is separate from the first connection and the bus;
  wherein the test module is configured to provide test transactions to the I/O controller using the second connection, and wherein the I/O controller is configured to provide the test transactions to a memory controller using the bus to cause tests to be performed on the memory using direct memory access (DMA).

16. The computer system of claim 15 further comprising:
  the operating system;
  wherein the processor is configured to cause the operating system to be booted, and wherein the test module is configured to cause the tests to be performed on the memory using DMA subsequent to the operating system being booted.

17. The computer system of claim 15 further comprising:
  the operating system;
  wherein the processor is configured to cause the operating system to be executed, and wherein the test module is configured to cause the tests to be performed on the memory using DMA during execution of the operating system.

18. The computer system of claim 15 wherein the bus comprises a system bus.

19. The computer system of claim 15 wherein the test transactions include read and write transactions.

20. The computer system of claim 19 wherein the read and write transactions comprise direct memory access (DMA) transactions.

* * * * *

UNITED STATES PATENT AND TRADEMARK OFFICE
CERTIFICATE OF CORRECTION

| | |
|---|---|
| PATENT NO. | : 7,350,109 B2 |
| APPLICATION NO. | : 10/714302 |
| DATED | : March 25, 2008 |
| INVENTOR(S) | : Andrew H. Barr et al. |

It is certified that error appears in the above-identified patent and that said Letters Patent is hereby corrected as shown below:

In column 3, line 27, delete "/O" and insert -- I/O --, therefor.

In column 7, line 33, in Claim 14, delete "contro1ler" and insert -- controller --, therefor.

Signed and Sealed this

Twenty-second Day of July, 2008

JON W. DUDAS
*Director of the United States Patent and Trademark Office*